United States Patent [19]

Reithmaier et al.

[11] Patent Number: 5,171,370
[45] Date of Patent: Dec. 15, 1992

[54] EFFUSION CELL OF A MOLECULAR BEAM EPITAXY SYSTEM

[75] Inventors: Johann-Peter Reithmaier, Niederviehbach; Heinrich Schloetterer, Putzbrunn-Solalinden, both of Fed. Rep. of Germany

[73] Assignee: Siemens Aktiengesellschaft, Munich, Fed. Rep. of Germany

[21] Appl. No.: 510,517

[22] Filed: Apr. 18, 1990

[30] Foreign Application Priority Data

Apr. 19, 1989 [DE] Fed. Rep. of Germany ....... 8904944
May 17, 1989 [DE] Fed. Rep. of Germany ....... 3916017

[51] Int. Cl.$^5$ .............................................. C23C 14/24
[52] U.S. Cl. ...................................... 118/726; 118/715
[58] Field of Search ................................ 118/715, 726

[56] References Cited

U.S. PATENT DOCUMENTS

| | | | |
|---|---|---|---|
| 4,239,955 | 12/1980 | Cho | 219/271 |
| 4,543,467 | 9/1985 | Eisele et al. | 219/271 |
| 4,646,680 | 3/1987 | Maki | 118/726 |
| 4,800,100 | 1/1989 | Herbots et al. | 118/715 |

FOREIGN PATENT DOCUMENTS 3421538 12/1985 Fed. Rep. of Germany.
3715644 12/1988 Fed. Rep. of Germany.
2490250 9/1981 France.

OTHER PUBLICATIONS

Article for Journal of Vacuum Science Tech., Jay A. Curless vol. 3, No. 2, Mar./Apr. 1985.
Patent Abstract of Japan 61-186284 (C-396) Jan. 9, 1987, vol. 11/No. 8.
Patent Abstract of Japan 61-91094 (C-372) Sep. 12, 1986 vol. 10/No. 269.
Patent Abstract of Japan 63-28210- (C-576) Mar. 14, 1989 vol. 13/No. 107.
Patent Abstract of Japan 63-252996 (C-567) Feb. 10, 1989 vol. 13/No. 61.

Primary Examiner—Richard Bueker
Attorney, Agent, or Firm—Hill, Van Santen, Steadman & Simpson

[57] ABSTRACT

An apparatus with a crucible in an effusion cell of a molecular beam epitaxy system provides the crucible shaped and mounted in such a way that the molecular beam is optimized relative to the substrate. In particular, when a circular substrate is tilted relative to the beam direction, the shape of the crucible, of the crucible mount, and the alignment of the center axis of the crucible relative to the center axis of the cell are adapted to optimize the beam impingement on the substrate.

13 Claims, 1 Drawing Sheet

EFFUSION CELL OF A MOLECULAR BEAM EPITAXY SYSTEM

BACKGROUND OF THE INVENTION

1. Field of the Invention

The present invention relates generally to a crucible in an effusion cell of a molecular beam epitaxy system for use in coating a substrate.

2. Description of the Related Art

Molecular beam epitaxy (MBE) is a method for controlling the growth of single-crystal semiconductor layers on a substrate over a range of layer thicknesses from 0.1 nm through 10 μm. In a solid-source molecular beam epitaxy, materials are thermically evaporated for this purpose in an ultra-high vacuum in special crucibles. The material which is released forms a molecular beam in pressure ranges of typically less than $10^{-6}$ mbar. The evaporator for such molecular beam epitaxy systems has a certain directional characteristic which is dependent upon the shape of the crucible. In order to achieve high yields in hetero layer structure components for semiconductor manufacturing, a relatively great uniformity in layer thickness during the use of molecular beam epitaxy is a prerequisite.

The uniformity of the thickness of a semiconductor layer when using a solid-source molecular beam epitaxy system is determined by:
1. the shape of the crucible,
2. the geometrical arrangement of the crucible with respect to the substrate, and
3. the rotation of the substrate.

Various materials in various effusion cells are used for the manufacture of more recent semiconductor structures. To that end, it is necessary to provide an arrangement of the effusion cells which is rotationally symmetrical to the normal of the surface of the substrate. Any asymmetry arising therefrom in the distribution of the material flow over the substrate wafer is, in turn, partially compensated by rotating the wafer.

There are two concepts or methods which have been essentially pursued up to now to optimize the uniformity of the layer thicknesses in epitaxy systems. The first concept is the employment of a cylindrical, slightly conical crucible having a small opening that produces advantages in the temperature regulation. Furthermore, such crucibles produce strong collimation of the molecular beam, and thus result in, only slight losses of material. The disadvantage in the use of such crucible with strong beam collimation is that uniformity of layer thickness is not easily achieved, although attempts to compensate for the lack of uniformity include dislocation of the maximum of the flow distribution from the center of the substrate to the edge of the substrate by tilting the axis of the cell. Using rotation of the substrate as an averaging method, a smaller layer thickness variation over a larger substrate region is achieved than without tilting.

The second concept is the use of more pronouncedly conical crucibles having a circular cross section in which the whole source surface has direct visual contact with the entire substrate surface. This means that the cross section of the crucible here as well as below is a section perpendicular to the center axis of the crucible, i.e. perpendicular to the molecular beam direction. The axis of symmetry is thereby aimed nearly at the center of the substrate, as disclosed, for example, in the publication of J. A. Curless, J.Vac.Sci.Technol.B3 (2), pages 531–534 (1985). The rotation here now only compensates for the effect of the oblique incidence of the molecular beam onto the substrate wafer, so that a noticeable improvement in the homogeneity thereof as compared to the first method is fundamentally achieved.

A French patent application 2490250 discloses a molecular beam epitaxy system wherein conical crucibles as shown in the second figure thereof are used. The molecular beam is obliquely directed onto the substrate and the aperture angle of the crucible is selected of such a size that the entire substrate is swept by the molecular beam.

In Japanese published application JP 6191094 is likewise disclosed a conical crucible having an aperture angle that provides for an adequately large expansion of the molecular beam.

In a Japanese published application JP 63-282190 is disclosed a conical crucible that is circular in a section normal to the longitudinal axis but having an opening cut at an angle to the axis so that the opening is therefore elliptical. This shaping relates to the integration of the crucible into the molecular beam system and does not relate to the cross-sectional shape of the emerging molecular beam.

A Japanese patent application JP 63-252996 discloses a flattened crucible which is obliquely cut, thereby providing an oblong, ellipse-like opening. This opening is intended to enable a large-area, uniform coating of the substrate.

The second method achieves greater uniformity of thickness over a larger substrate region than the aforementioned method. However, to achieve a beam flow distribution as in the second method in systems that are optimized according to the first concept, the aperture angle of the conical crucible can only be fundamentally made so large that the entire substrate is situated in the region of the direct molecular beam. This, however, has the following disadvantages:
1. The usable crucible volume decreases noticeably at a given crucible orifice.
2. The growth rates are extremely dependent on the filling of the crucible.
3. A large percentage of the material bypasses the substrate wafer.
4. A large part of the heat radiation also bypasses the substrate and heats up the growth chamber at undesired locations.
5. The cross section of the molecular beam in the plane of the substrate is nearly elliptical, so that the material flow is not fully utilized given standard circular substrates and substrate carriers.

SUMMARY OF THE INVENTION

It is an object of the present invention to provide an apparatus with a crucible in an effusion cell of a molecular beam epitaxy system wherein the effusion cell is tilted at an angle relative to the substrate and wherein the molecular beam is optimized in view of the consumption of the material.

This object and other objects and advantages are achieved in an apparatus having an aperture angle of the crucible, a shape of the cross section of the crucible perpendicular relative to the center axis of the crucible, and an alignment of the center axis of the crucible which define the cross section and direction of the molecular beam emerging from the crucible so that the molecular beam at least largely exactly impinges the substrate.

Further developments of the invention are provided by the shape of the cross section of the crucible perpendicularly relative to the center axis of the crucible being such that the emerging molecular beam as is at least largely elliptical in cross section for a circular substrate. Further advantages are provided by the cell being arranged so that the center axis of the cell lies outside the center of the substrate and the center axis of the crucible is aligned with the center of the substrate for a circular substrate. In such arrangement, the cell is provided with a crucible mount that has a shape that results in the center axis of the cell being at an angle to the center axis of the crucible. A collar may be provided for the crucible for fastening the crucible in the cell, wherein the collar is of such a shape that it provides alignment of the center axis of the crucible relative to the cell. A collar provided for the crucible for fastening the crucible in the shell may be shaped such that the interior of the cell which lies between the outside wall of the crucible and the inside wall of the cell is closed to the outside.

DETAILED DESCRIPTION OF THE PREFERRED EMBODIMENTS

Figure 1:
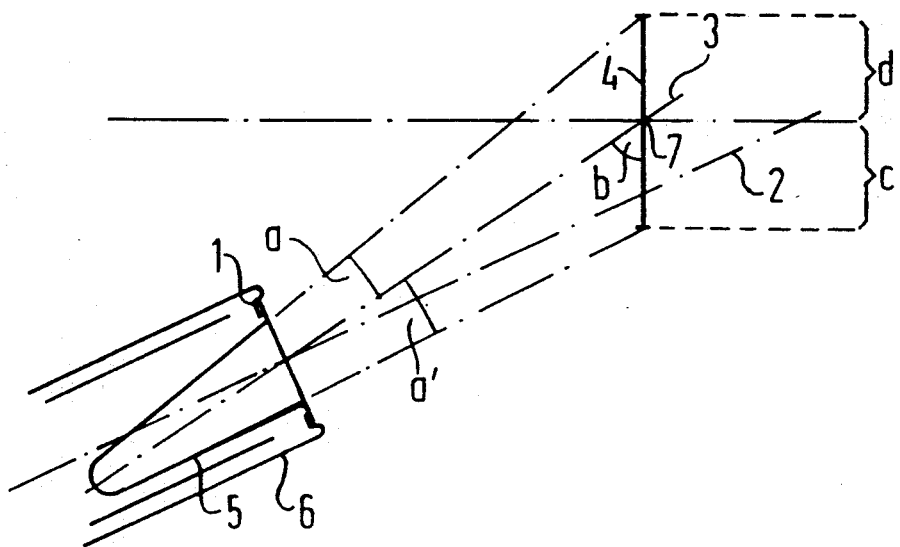
FIG. 1 is a schematic diagram of a molecular beam epitaxy system having a cell and crucible arrangement according to the principles of the present invention.

An apparatus shown schematically in FIG. 1 is part of a molecular beam epitaxy system, the illustrated apparatus being employed when a plurality of effusion cells are arranged in front of a circular substrate 4 to be coated and when the individual molecular beams are to impinge the substrate obliquely. In these cases, the apparatus of the invention offers the advantage that the molecular beam is optimally directed onto the substrate 4, so that the entire molecular beam, as shown in broken outline at 8, strikes the substrate 4 and, at the same time, an optimally uniform coating on the substrate is assured. The present apparatus achieves this by the shaping of the crucible 5 which is designed so that the molecular beam 8 has a cross section that corresponds to the projection of the substrate 4 in the beam direction.

As shown in FIG. 1, the crucible 5 in the apparatus of the invention is tilted relative to a cell 6. This achieves an alignment of the center axis 3 of the crucible 5 to a center 7 of the substrate 4 to be coated. A center axis 2 of the effusion cell 6 simultaneously proceeds outside of this center 7 of the substrate 4 to be coated. An aperture angle a and a' is dimensioned to be so small that the molecular beam 8 sweeps only the subject 4 to be coated. A particular advantage of this arrangement is that nothing need be modified either in an existing cell arrangement having a center axis directed eccentrically to the substrate center or in the actual cell design. The apparatus of the invention can thereby be simply installed in systems that already exist.

The critical features for the shaping of the crucible 5 are:

1. the size and the shape of the orifice of the crucible 5,
2. the aperture angle (a+a'),
3. the shape of the crucible cross-section, and
4. the shape and arrangement of a collar for the crucible 5.

It is to be understood here that the orifice of the crucible 5 is the linear projection of the sidewalls of the crucible 5 into the plane that is formed by the front edge of the effusion cell 6. To accomplish the alignment of the molecular beam 8, the cross sections of the crucible 5 according to the above-recited definition are similar to one another over nearly the entire crucible length, and they differ only in scale. A collar is provided for the crucible 5 attached to the orifice thereof and serving the purpose of fastening the crucible 5 to a crucible mount 1 in the cell 6.

The orifice of the crucible 5 and the sidewalls thereof that define the limitation of the molecular beam 8 are formed so that the lateral limitation of the molecular beam 8 just coincides with the limitation of the substrate 4. The center axis 3 of the crucible 5 impinges the substrate 4 in approximately the center 7 thereof. In the specific instance of a crucible 5 having a circular cross section wherein the center axis 3 forms the median line of the molecular beam in the cross section shown in FIG. 1, i.e. where the angles a=a', the relationship $$c \sin (a+b) = d \sin (b-a)$$

derives with the reference characters shown in FIG. 1. The center axis 3 of the crucible 5 then impinges the substrate 4 offset in a downward direction by an amount $(d-c)/2$ from the actual center 7.

Figure 2:
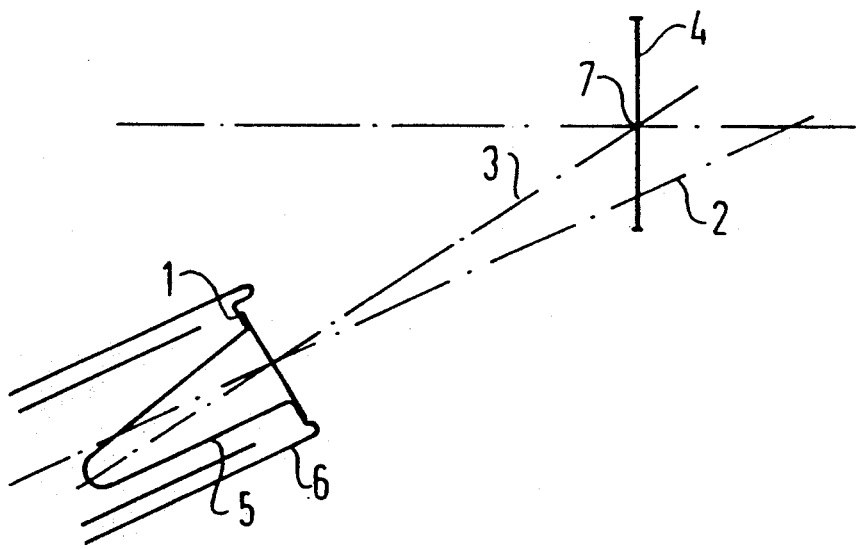
FIG. 2 is a schematic diagram of an alternate embodiment of the molecular beam epitaxy system of the present invention.

FIGS. 1 and 2 show an apparatus having a crucible 5 in an effusion cell 6, whereby the crucible 5 is tilted in the cell such that the center axis 3 of the crucible 5 describes an angle e with the center axis 2 of the cell 6. In the apparatus of the invention, such a tilting of the crucible 5 in the cell 6 is necessary for optimizing the molecular beam given a cell 6 whose center axis 2 proceeds outside the center 7 of the substrate 4.

To effect this potentially required tilting of the crucible 5 in the cell 6, i.e. in order to cause an angle of greater than 0 between the center axis 3 of the crucible 5 and the center axis 2 of the cell 6, the upper edge of the crucible 5 that is provided with a collar for fastening the crucible 5 to the crucible mount 1 must be fashioned such that the tilting is accomplished. A plane in which the collar lies is thereby not perpendicular to the center axis 3 of the crucible 5. The crucible orifice itself is elliptical.

In the case of a modified crucible mount 1, i.e. of a crucible mount 1 that is not formed rotationally symmetrical with reference to the cell 6, the opening of the crucible 5 itself can be circular. This is shown in FIG. 2.

The cross section of the molecular beam 8 is circular given a crucible 5 having a circular cross section. A further optimization of the molecular beam 8 onto the substrate 4 is not possible with this circular cross section of the crucible 5. For further optimization, the apparatus of the invention provides that the shape of the crucible 5 may also be altered to such effect that an ellipse approximately derives for the cross section of the crucible 5 and thus of the molecular beam 8. In the case of a molecular beam 8 aligned exactly parallel, so that the angle a=0, the cross section would exactly be an ellipse. To achieve this further optimization of the molecular beam 8, the crucible 5 is inventively fashioned in a flattened form. In other words, the crucible is elliptical in cross section. The crucible 5 has an opening and an aperture angle a+a' is adapted to the requirements of the optimization to such effect that the molecular beam 8 is expanded exactly to the dimensions of the substrate 4 at the location of the substrate 4.

In the specific instance wherein the cell is arranged so that its center axis 2 lies outside the center 7 of the substrate 4, the necessary tilting of the crucible 5 relative to the cell 6 supplies additional boundary conditions which relate to the shaping of the crucible. The space that is occupied by the crucible 5 is restricted by the inside wall or by other inside parts of the cell 6. With a given spacing of the cell 6 from the substrate 4, with the aperture angle of the molecular beam 8 required during the course of optimization, and with the tilt angle of the crucible 5 in the cell 6 required in accord with the arrangement of the cell 6, the crucible orifice may potentially have to be diminished in size such that an adequate tilting of the crucible 5 in the cell 6 is possible. The collar for the crucible 5 is then expediently fashioned broad enough so that the part of the interior of the cell 6 that is not occupied by the crucible 5 is closed in an outward direction by this collar of the crucible 5. The crucible mount 1 of the cell 6 can also be modified in corresponding fashion.

The advantages of the apparatus of the invention are that the whole source surface in the crucible 5 has full visual contact with the substrate surface, that a smaller aperture angle compared to the prior art is required at the same time, that the crucible volume may also be dimensioned significantly larger, and that the material losses are greatly reduced. As a result of the smaller angle, there is a diminished dependency on the filling level, i.e. on the height of the material filled in the crucible. The crucible shape itself can continue to be circularly symmetrical. For example, the crucible is then provided with a collar tilted by the angle e between the center axes 2 and 3 to be matched to the crucible mount 1 that is arranged dynamically balanced with respect to the center axis 2 of the cell 6.

Thus, there is shown and described an apparatus in which a crucible is provided in an effusion cell of the molecular beam epitaxy system. The molecular beam is optimized to a circular substrate that is tilted relative to the beam direction, the optimization being by shaping of the crucible and the crucible mount and by alignment of the center axis of the crucible relative to the center axis of the cell.

Although other modifications and changes may be suggested by those skilled in the art, it is the intention of the inventors to embody within the patent warranted hereon all changes and modifications as reasonably and properly come within the scope of their contribution to the art.

We claim:

1. An apparatus for use in a molecular beam epitaxy system for treating a substrate to be coated, the substrate being mountable at a predetermined substrate position to occupy a predetermined substrate area, comprising:

an effusion cell;

a crucible in said effusion cell, said crucible being arranged eccentrically relative to the predetermined substrate position, said crucible having an aperture angle and having a shape in cross section perpendicular to a center axis of said crucible and having an alignment of the center axis of said crucible all of which define a cross section and direction of a molecular beam emerging from said crucible such that the molecular beam intersects said predetermined substrate position and at least nearly completely impinges said predetermined substrate area.

2. An apparatus as claimed in claim 1, wherein said predetermined substrate area is generally circular; and wherein said crucible has a shape in cross section perpendicular to the center axis of said crucible such that the molecular beam emerging from said crucible is approximately elliptical in cross section.

3. An apparatus as claimed in claim 1, wherein said predetermined substrate area is generally circular;

wherein said effusion cell is arranged such that a center axis of said effusion cell lies outside of a center of said predetermined substrate area; and wherein said crucible has a center axis aligned at least near to the center of said predetermined substrate area.

4. An apparatus as claimed in claim 3, further comprising:

a crucible mount in said effusion cell of a shape to establish an angle between the center axis of said effusion cell and a center axis of said crucible.

5. An apparatus as claimed in claim 1, further comprising: a collar on said crucible fastening said crucible to said effusion cell, said collar being of a shape to provide an oblique angular alignment of the center axis of said effusion cell relative to the center axis of said crucible.

6. An apparatus as claimed in claim 1, further comprising:

a collar on said crucible fastening said crucible to said effusion cell, said collar being of a shape such that an interior space within said effusion cell lying between an inside wall of said effusion cell and an outside wall of said crucible is closed to outside.

7. An apparatus for use in a molecular beam epitaxy system for treating a substrate to be coated, the substrate being mountable at a predetermined position, comprising:

an effusion cell;

a crucible in said effusion cell, a fixed center of said predetermined position;

said effusion cell being arranged such that a center axis of said effusion cell lies outside of said fixed center of said predetermined position; and said crucible being arranged relative to said effusion cell so that a center axis of said crucible passes through said fixed center of said predetermined position.

8. An apparatus as claimed in claim 7, further comprising:

a crucible mount in said effusion cell of a shape to establish an oblique angle between the center axis of said effusion cell and a center axis of said crucible.

9. An apparatus as claimed in claim 7, further comprising:

a collar on said crucible fastening said crucible to said effusion cell, said collar being of a shape to provide an oblique angular alignment of the center axis of said effusion cell relative to the center axis of said crucible.

10. An apparatus as claimed in claim 7, further comprising:

a collar on said crucible fastening said crucible to said effusion cell, said collar being of a shape such that an interior space of said effusion cell lying between an inside wall of said effusion cell and an outside wall of said crucible is closed to outside.

11. An apparatus for molecular beam epitaxy for directing a coating beam onto a substrate to be coated, comprising:

an effusion cell defining a center cell axis;

a crucible in said effusion cell and defining a center crucible axis; and means for mounting said crucible in said effusion cell so that said center cell axis lies at an angle to said center crucible axis.

12. An apparatus as claimed in claim 11, wherein said means for mounting comprises a collar securing an edge of said crucible at an angle to an end of said effusion cell.

13. An apparatus as claimed in claim 11, wherein said means for mounting comprises an end face of said crucible at an oblique angle to said center crucible axis, and a collar mounting said end face of said crucible substantially parallel to an end of said effusion cell.

* * * * *